United States Patent [19]
Morgan et al.

[11] Patent Number: 5,440,517
[45] Date of Patent: * Aug. 8, 1995

[54] DRAMS HAVING ON-CHIP ROW COPY CIRCUITS FOR USE IN TESTING AND VIDEO IMAGING AND METHOD FOR OPERATING SAME

[75] Inventors: Donald M. Morgan; Michael A. Shore, both of Boise, Id.

[73] Assignee: Micron Technology, Inc., Boise, Id.

[*] Notice: The portion of the term of this patent subsequent to Jan. 10, 2012 has been disclaimed.

[21] Appl. No.: 290,388

[22] Filed: Aug. 15, 1994

[51] Int. Cl.$^6$ ................................................. G11C 7/00
[52] U.S. Cl. .............................. 365/202; 365/189.08; 365/195; 365/201
[58] Field of Search .................... 365/202, 189.08, 195, 365/189.01, 201

[56] References Cited

U.S. PATENT DOCUMENTS

| | | | |
|---|---|---|---|
| 5,241,500 | 8/1993 | Barth, Jr. et al. | 365/189.01 |
| 5,293,340 | 3/1994 | Fujita | 365/201 |
| 5,315,598 | 5/1994 | Tran | 371/21.1 |
| 5,355,337 | 10/1994 | Kim | 365/200 |

Primary Examiner—David C. Nelms
Assistant Examiner—Andrew Q. Tran
Attorney, Agent, or Firm—Wells, St. John, Roberts, Gregory & Matkin

[57] ABSTRACT

A DRAM integrated circuit device has a memory array with multiple row access lines, multiple paired digit lines that intersect the row access lines, and a plurality of memory cells coupled at the intersections to form rows of memory cells. The row access lines are used to access associated rows of memory cells and the paired digit lines are used to carry data to and from the access memory cells. An equilibrate control is coupled to the digit lines to erase data thereon. An on-chip row copy circuit is provided to copy data carried by the paired digit lines and stored in a first row of memory cells to at least one other row of memory cells by suspending activation of the equilibrate control to prevent erasure of the data on the paired digit lines.

7 Claims, 3 Drawing Sheets

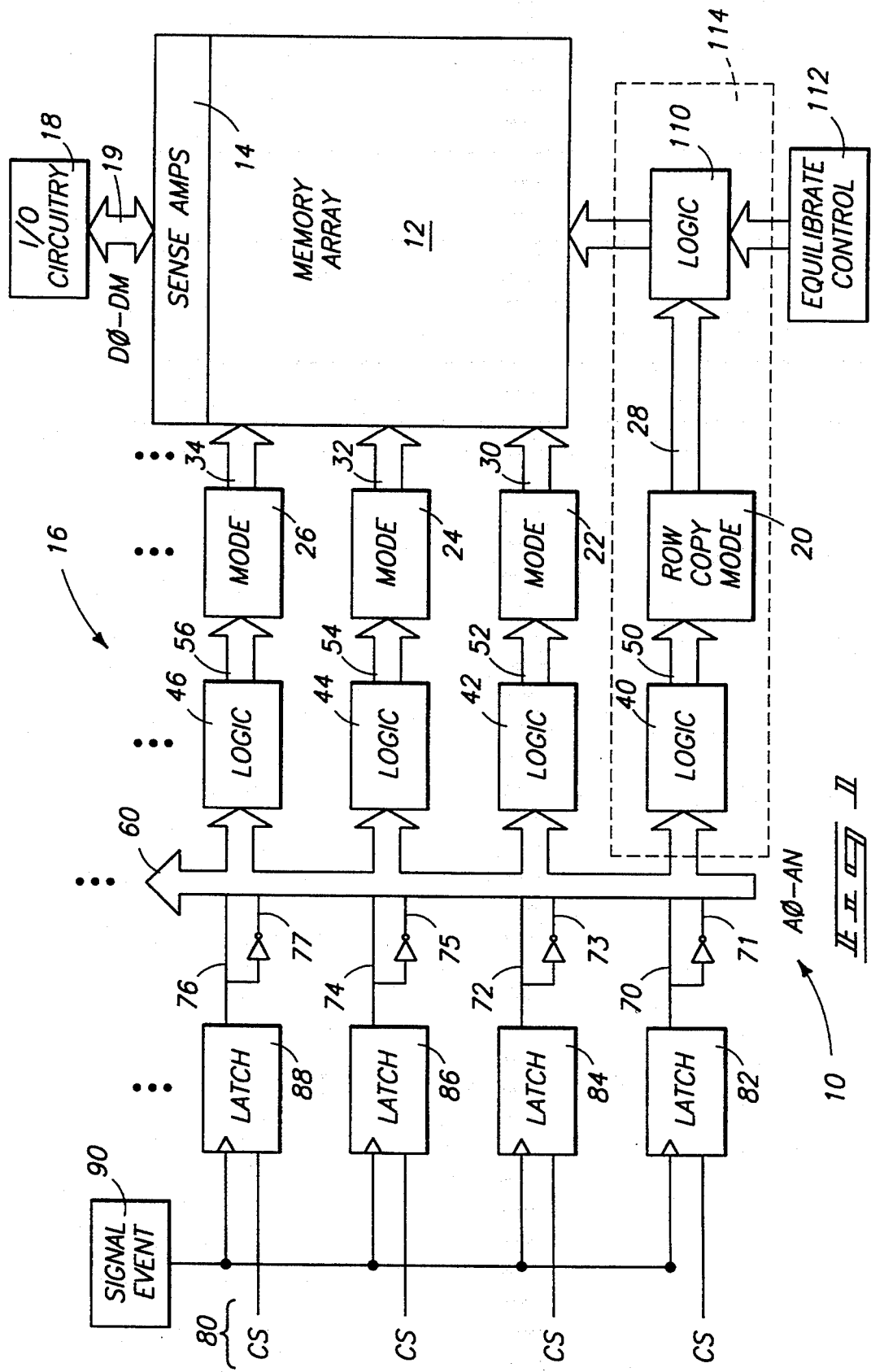

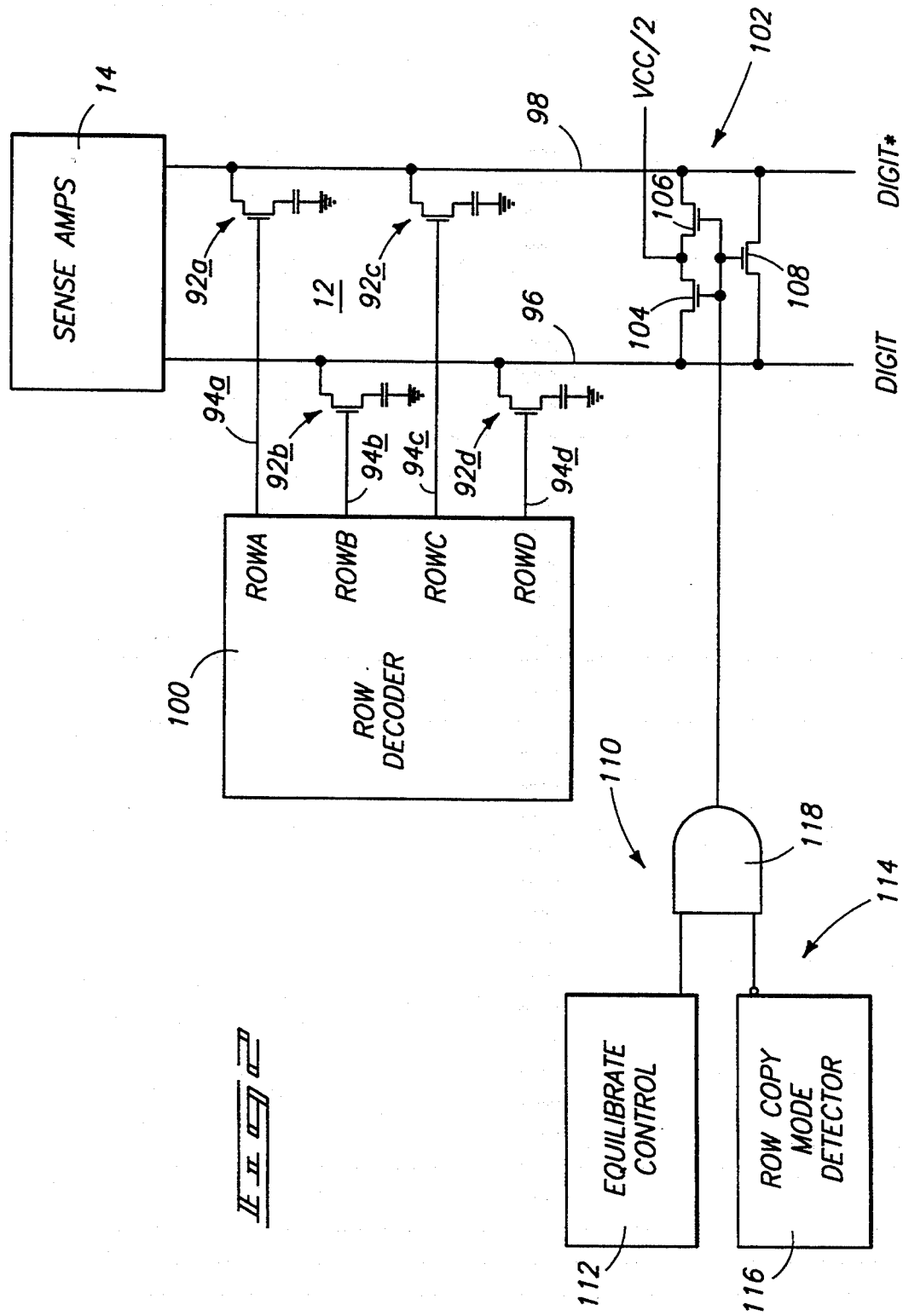

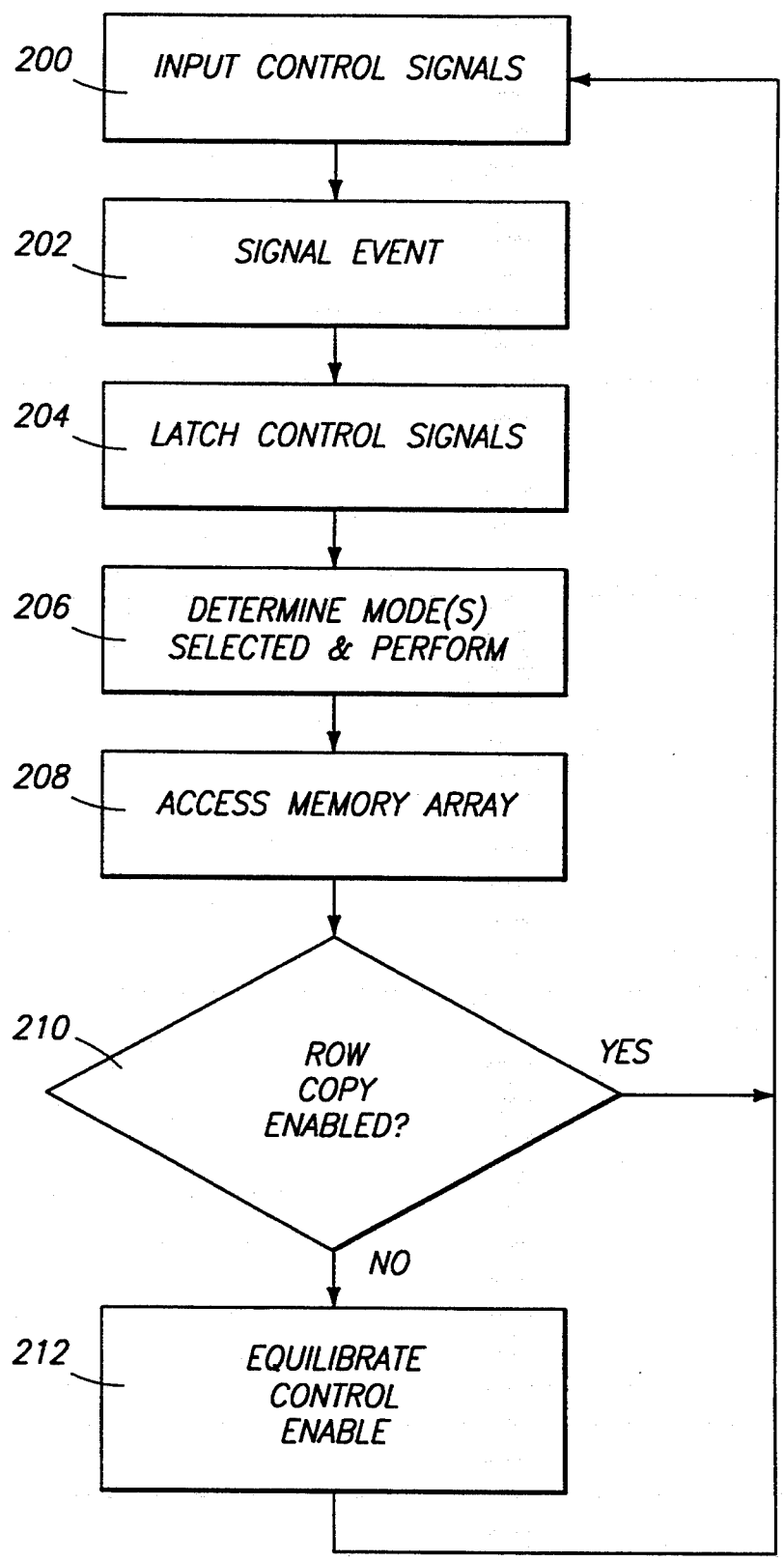

DRAMS HAVING ON-CHIP ROW COPY CIRCUITS FOR USE IN TESTING AND VIDEO IMAGING AND METHOD FOR OPERATING SAME

TECHNICAL FIELD

This invention relates to dynamic random access memories (DRAMs) as wells as more complex, DRAM based memories such as VRAMs. More particularly, this invention relates to DRAMs which have an on-chip row copy circuit for copying data from one row to another during a single row access cycle. This invention also relates to methods for operating such DRAMs.

BACKGROUND OF THE INVENTION

DRAMs (Dynamic Random Access Memories) are highly integrated semiconductor memory circuits. DRAM devices are well-known in the art.

This invention concerns a novel construction of a DRAM for use in video imaging. Presently, the video imaging process primarily employs a special kind of integrated circuit (IC) memory device known as a video random access memory (VRAM). VRAMs incorporate more circuitry than is customarily employed in conventional DRAMs to enable faster memory speeds which are required by such video imaging processes. While VRAMs are widely used, DRAMs also have a market in the video arena, particularly for those customers who do not require the faster access speeds. DRAMs have adequate speeds and are less expensive to use. Accordingly, there is a performance/cost tradeoff between alternative use of VRAMs and DRAMs in the video imaging market, with DRAMs having lower performance and lower cost than the VRAMs. It would be advantageous to employ DRAMs to perform those tasks in video image processing that do not require high speeds.

One particular operation which may be performed using a VRAM is a "row copy" function. This function allows the identical data to be written in multiple rows of memory cells. In video imaging, this function is useful when creating a solid block area on a video screen that requires a repetition of information. For example, in word processing screen displays, the background images often comprise an entire screen of a single color, such as blue, black or green. The written text is then produced in another color on top of this background image. The solid block background area is created by the row copy operation. Each bit of memory information is the same for each column and row in the memory array assigned to that block of color.

The row copy function is a highly repetitious task that does not require fast access speeds and thus, does not require the high performance of VRAMs. It would be desirable if this function could be performed by the less expensive DRAMs so that the VRAMs could be freed to perform higher speed operations. The row copy function is implemented in firmware utilizing transfer modes only available on VRAMs. Although uniform backgrounds are used quite often in today's programs, there is no standard software/firmware designed to implement the repetitive operation in VRAMs. Separate software programs are written for the wide variety of VRAMs in use today. It would be desirable to have a standard, one cycle row copy mode on VRAMs to avoid the need for a firmware implementation. Unfortunately, firmware programs cannot be ported to the DRAMs.

An unrelated problem concerns graphic cards which employ only DRAMs. To create a background by performing the row copy function, these cards need other circuitry on the printed circuit board (PCB) to perform this operation. It would be desirable if the DRAMs could perform this function. The PCB could then be made less expensive. Moreover, additional space on the PCB that was created by eliminating the traditional row copy circuitry would be available for other features to be added to the card. Alternatively, a DRAM-implemented row copy would allow the same features as currently offered, but on a smaller PCB.

Another problem concerns testing DRAM and related devices. At various stages of fabrication, DRAM devices are tested by writing and reading a test pattern of data to the memory cells. Common test patterns include all binary "1"s or "0"s, alternating "1"s and "0"s, or a checkerboard of "1"s and "0"s. Prior art DRAMs use block and flash write operations which permit the writing of all binary "1"s or "0"s to the memory array. However, these modes are not included on all DRAMs and there is no technique for handling test patterns of mixed "1"s and "0"s. It would be desirable to design a DRAM which quickly produced any desired test pattern.

This invention concerns a DRAM device which overcomes the above drawbacks.

BRIEF DESCRIPTION OF THE DRAWINGS

Preferred embodiments of the invention are described below with reference to the accompanying drawings, which are briefly described below.

FIG. 1 is a block diagram of a DRAM integrated circuit device according to this invention.

FIG. 2 is a schematic of a preferred implementation of this invention.

FIG. 3 is a flow diagram illustrating the operation of the DRAM integrated circuit device in FIGS. 1 and 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts". (U.S. Constitution, Article 1, Section 8).

According to one aspect of this invention, a DRAM integrated circuit device comprises a memory array having first and second rows of memory cells and an on-chip circuit electrically coupled to the memory array. The on-chip circuit copies data in the first row of memory cells to the second row of memory cells while maintaining the data in the first row of memory cells.

More particularly, a DRAM integrated circuit device in the preferred implementation comprises:
 a memory array comprising:
  multiple rows of plural memory cells;
  multiple row access lines coupled to access corresponding rows of memory cells;
  multiple paired digit lines coupled to carry data to and from the memory cells, the data being expressed as a voltage differential between the digit lines in individual pairs;
  equilibration circuitry coupled to the paired digit lines to equalize voltage potential on the paired digit lines and thereby erase data from the paired digit lines;

access means for accessing first and second rows of memory cells in the memory array via the row access lines during respective first and second row access cycles;

data I/O means for placing data on selected paired digit lines during the first access row cycle;

an equilibrate control electrically coupled to the equilibration circuitry in the memory array, the equilibrate control being configured to actuate the equilibration circuitry following completion of the first row access cycle to erase the data on the paired digit lines after the first row is deselected; and an on-chip row copy circuit, electrically coupled to the memory array and the equilibrate control, to inhibit the equilibrate control from actuating the equilibration circuitry following completion of the first row access cycle to prevent erasure of the data on the paired digit lines so that the data carried by the paired digit lines which was previously stored in the first row of memory cells during the first row access cycle is copied to the second row of memory cells during the second row access cycle.

According to another aspect of this invention, a method for operating such DRAM integrated circuit devices comprises the following steps: (1) accessing a first row of memory cells in the memory array during a first row access cycle; (2) placing data on selected paired digit lines during the first row access cycle; (3) inhibiting the equilibration circuitry from erasing the data on the paired digit lines; and (4) accessing a second row of memory cells in the memory array during a second row access cycle so that the data carried by the paired digit lines and previously stored in the first row of memory cells during the first row access cycle is copied to and stored in the second row of memory cells during the second row access cycle.

FIG. 1 shows a DRAM integrated circuit device 10 according to this invention. DRAM 10 includes a memory array 12, sense amplifiers 14, mode select circuitry 16, and I/O circuitry 18. Memory array 12 is of conventional construction and includes rows of memory cells, row access lines, digit lines, row and column decoders, and equilibrate circuitry, as will be described below in more detail with reference to FIG. 2. I/O circuitry 18 facilitates the transfer of data D0-DM to and from memory array 12 via data bus 19.

DRAM integrated circuit device 10 may be operated according to several different modes of operation, as indicated by various modes controls 22, 24, and 26 in mode select circuitry 16. These modes are coupled to memory array 12 via buses 30, 32, and 34, respectively. Example modes of operation include flash modes, block write modes, read modes, etc. The various mode controls are coupled to the row and column decoders within the memory array 12 to selectively access the desired memory cells according to the specified mode of operation. This invention concerns a novel row copy mode control 20 which is coupled to memory array 12 via bus 28 (or alternatively, a single conductor) and logic circuitry 110 as described below in more detail.

The various modes of operation are selected based upon control signals CS, referenced generally by numeral 80. Control signals 80 may be derived from a truth table, or the like, to choose one or more particular modes of operation. The control signals are latched in respective latches 82-88 upon occurrence of a signal event 90. Example signaling events include the rising or falling edge of a row address strobe (RAS) signal or the rising or falling edge of the column address strobe (CAS) signal. Control signals 80, and their complements, are transferred from latches 82-88 and placed on address and control bus 60 via non-inverting and inverting paths 70-77.

Address and control bus 60 carries latched control signals 70-77 and address signals A0-AN. The control signals are extracted from bus 60 and decoded in mode selection logic 40, 42, 44, and 46 to actively select one or more respective modes 20-26 which control the memory array 12 in a desired manner. Mode selection logic 40-46 are coupled to the respective modes of operation 20-26 via corresponding buses 50-56. The address signals A0-AN may also be supplied through the logic and mode circuitry, or alternatively, input directly to the row and column decoders in memory array 12 for ready addressing upon selection of an appropriate mode of operation. The construction shown in FIG. 1 presents an adaptive and flexible representation of the DRAM device 10 in that it can perform multiple different modes of operation depending upon the control signals 80 input to the memory device.

With reference to FIG. 2, memory array 12 includes multiple rows of plural memory cells. A representative four rows A-D are illustrated, with one representative memory cell 92a-92d being shown in each row. Row access lines 94a-94d are coupled to the memory cells to help define the rows. Multiple pairs of digit lines, as represented by paired digit lines 96 and 98, intersect the row access lines 94a-94d and the memory cells are coupled at certain intersections of these lines. Although only one memory cell is shown in each respective row, there are typically hundreds of memory cells per row each on a separate DIGIT or DIGIT*. An example number might be 256 or 512 memory cells in each row.

Each memory cell 92a-92d comprises an access transistor and a storage capacitor. Row access lines 94a-94d are coupled to the gates of the access transistors in corresponding memory cells 92a-92d. Row access lines 94a-94d discriminately access desired rows of memory cells in response to respective signals ROWA-ROWD provided by the row decoder 100. Row decoder 100 is responsive to mode select circuitry 16 (FIG. 1). In this manner, mode select circuitry 16 and the row and column decoders in memory 12 form an access means for accessing one or more rows of memory cells in the memory array via the row access lines 94a-94d during various access cycles.

Paired digit lines 96 and 98 carry data to and from the memory cells. The paired construction is referred to as "folded bit line" or "folded digit line" construction, where pairs of lines carry complementary signals DIGIT and DIGIT*. The paired digit lines are coupled to the I/O circuitry 18 via data bus 19 (FIG. 1). Data is expressed on the folded digit line construction as a voltage differential between the two digit lines 96 and 98. For example, first digit line 96 might have a high voltage level Vcc of 4-5 volts which typically represents a binary "1", while second digit line 98 might have a low voltage level of 0 volts which typically represents a binary "0". These voltage levels are transferred between the paired digit lines and the storage capacitors of the memory cells 92a-92d via the access transistors in response to activation signals ROWA-ROWD from row decoder 100. According to this configuration, I/O circuitry 18, data bus 19, sense amplifiers 14, and paired digit lines 96 and 98 form a data I/O means for placing data on selected paired digit lines during an access cycle.

Memory array 12 also includes equilibration circuitry 102 which is coupled to the pair of digit lines 96 and 98 to equalize the voltage potential on the paired digit lines, and thereby erase the data. Equilibration circuitry 102 includes transistors 104, 106, and 108. When equilibration circuitry 102 is actuated, the voltage levels on digit lines 96 and 98 are equalized to Vcc/2 (e.g., 2.0–2.5 volts).

The construction of memory array 12 is conventional and well-known in the art. Other patents describing the construction of the memory arrays, sense amplifiers, and other components in more detail include the following, which are hereby incorporated by reference: U.S. Pat. No. 5,042,011 which describes a sense amplifier pull-down device with tailored edge input; U.S. Pat. No. 4,962,326 which is directed to a reduced latch-up in precharging I/O lines to sense amplifier signal levels; U.S. Pat. No. 4,748,349 which discloses a high performance, dynamic sense amplifier with voltage boost for row address lines; U.S. Pat. No. 4,636,987 which pertains to a semiconductor dynamic memory device with multiplexed sense amplifier and write-activated active loads; U.S. Pat. No. 4,634,901 which describes a sense amplifier for CMOS semiconductor memory devices having a symmetrically balanced layout; U.S. Pat. No. 4,606,010 which describes a dynamic memory device; U.S. Pat. No. 4,533,843 which discloses a high performance dynamic sense amplifier with voltage boost for row address lines; U.S. Pat. No. 4,543,500 which describes a high performance dynamic sense amplifier voltage boost for row address lines; and U.S. Pat. No. 4,141,081 which is directed to an NMOS BORAM sense amplifier latch.

According to this invention, DRAM integrated circuit device 10 includes a novel row copy mode 20 which is electrically coupled to memory array 12 via logic 110. An equilibrate control 112 is likewise coupled to memory array 12 via logic 110. Equilibrate control 112 is preferably coupled to equilibration circuitry 102 (FIG. 2) in the memory array, and is configured to actuate the equilibration circuitry following the various modes of operation. For example, following a read mode of operation, the equilibrate control 112 actuates equilibration circuitry 102 to remove the previous data on paired digit lines 96 and 98.

Row copy mode 20, mode selection logic 40, and logic 110 form an on-chip row copy circuit 114 (FIGS. 1 and 2) used to copy data stored in a first row of memory cells to a second row of memory cells while maintaining the data in the first row of memory cells. In general, the on-chip copy circuit facilitates the data copy function by suspending activation of equilibrate control 112 to prevent erasure of the data on the paired digit lines 96 and 98. If equilibration is undertaken, the voltage levels on paired digit lines 96 and 98 are equalized to Vcc/2 to remove all data in preparation for receiving new data during the next access cycle. By skipping the equilibration operation, the same data can be reused for one or more other rows by simply accessing the one or more other rows while the data remains on the paired digit lines. Accordingly, one full row of data can be copied during each row access cycle.

FIG. 2 illustrates a preferred implementation of the on-chip row copy circuit 114. It comprises a row copy mode detector 116, which is formed of row copy mode 20 and mode selection logic 40, to detect when a row copy function is enabled and to output a row copy enable signal upon detection. Row copy circuit 114 also includes logic circuitry 110 in the form of an AND gate 118 coupled between the row copy mode detector 116 and the equilibrate control 112 to selectively suspend activation of the equilibrate control depending upon the row copy enable signal. More particularly, the equilibrate control 112 outputs an equilibrate control signal used to actuate the NMOS transistors 104–108 of equilibration circuitry 102. AND gate 118 will pass the equilibrate control signal to the memory array so long as the row copy mode detector is disabled. However, once the row copy mode is enabled and outputs a row copy enable signal, the AND gate 118 blocks the equilibrate control signal from actuating circuitry 102. AND gate 118 is the preferred implementation of logic 110, although other logic circuitry which provides a desired boolean function of the equilibrate control signal and the row copy enable signal can be used.

FIG. 3 illustrates the operation of the DRAM integrated circuit device 10 according to this invention. At step 200, the control signals CS are input. A signal event 90 is triggered to latch the control signals CS in latches 82–88 (steps 202 and 204). One or more modes of operation are selected and performed at step 206. For example, the DRAM device might perform a read or write mode of operation followed by a row copy mode of operation. The memory array 12 is then accessed using the address A0–AN to read, write, or otherwise manipulate the data D0–DM going to or from selected memory cells according to the desired mode of operation (step 208).

At step 210, a check is made to determine whether row copy mode 20 is enabled. If it is enabled, the equilibrate operation from equilibrate control 112 is bypassed. Flow returns to step 200 where the same or new control signals are read and latched (steps 200–204) and a new location of memory cells, such as the next adjacent row, can be accessed (step 208). Because there was no equilibrate operation, the digit lines retain the same data information. Thus, when the next row of memory is accessed, the same data can be copied onto this row without losing the first row of data.

On the other hand, if row copy 20 is not enabled (i.e., the "no" branch from step 210), the equilibrate control 112 is enabled to remove the data from the digit lines in preparation for receiving new data for the memory cells (step 212).

For purposes of the continuing discussion, suppose that a first row A is initially accessed via steps 200–208 (FIG. 3) during a first row access cycle. Data is placed on paired digit lines DIGIT/DIGIT* during the first row access cycle by either writing data to, or reading data from, the memory cells in row A (as represented by memory cell 92a). If row copy mode 20 is enabled, AND gate 118 outputs a low voltage level regardless of the state of equilibrate control 112 and thus transistors 104–108 are turned "off". Accordingly, the complementary data DIGIT/DIGIT* on paired digit lines 96 and 98 remains. When a second row is accessed (for example, row B) during steps 200–208 (FIG. 3) during a second row access cycle, the data on the digit lines 96 and 98 is copied onto the newly accessed row of memory cells (such as memory cell 92b on row B).

The row copy is accomplished without any data loss on row A. Access to row A is ceased and the access transistor in the memory cell 92a is turned "off" before the next function (which might be, for example, a row copy or an equilibrate function). As a result, the storage capacitors of the memory cells 92a are isolated to retain the previously stored data.

If row copy mode 20 is disabled and equilibrate control 112 is enabled, AND gate 118 outputs a high voltage level to turn "on" transistors 104–108. With these transistors "on", the digit lines 96 and 98 are shorted together to equalize their voltage potential to Vcc/2, thereby removing the data thereon.

It is noted that all modes of operation should be performed in the memory array before the row copy mode is enabled. In this manner, the last data provided on the folded digit line pairs can be repeated and copied as desired.

It is further noted that the data can be copied to one or more additional rows in any desired randomly selected order. That is, data can be written to row A and then copied sequentially to row C, row D, and row B. In this manner, data can be copied to any other arbitrary row that is sharing the same paired digit lines in the memory array. This is highly advantageous when testing the DRAM integrated circuit device 10 because any desired test pattern can be quickly placed in memory array 12 to reduce the time it takes to test such devices.

This invention therefore provides a DRAM integrated circuit device having on-chip row copy circuit. This allows the less expensive DRAM chips to perform the slow and repetitive task of copying identical information from row to row. This in turn frees up the VRAM to perform other high speed operations, thereby improving the entire video imaging process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A DRAM integrated circuit device, comprising:
  a memory array having multiple row access lines, multiple paired digit lines that intersect the row access lines, and a plurality of memory cells coupled at intersections of individual row access lines and paired digit lines to form rows of memory cells; the row access lines being used to access associated rows of memory cells and the paired digit lines being used to carry data to and from the accessed memory cells;
  an equilibration circuit, electrically coupled to the paired digit lines of the memory array, to equalize potentials on the paired digit lines; and
  an on-chip copy circuit, electrically coupled to the memory array and the equilibration circuit, to copy data carried by the paired digit lines and stored in a first row of memory cells to at least one other row of memory cells by suspending activation of the equilibration circuit to prevent equalization of potentials on the paired digit lines.

2. A DRAM integrated circuit device according to claim 1 wherein the on-chip copy circuit comprises:
  a row copy mode detector to detect when a row copy function is enabled and to output a row copy enable signal upon detection; and
  logic circuitry coupled to the row copy mode detector and the equilibration circuit to selectively suspend activation of the equilibration circuit depending upon the row copy enable signal.

3. A DRAM integrated circuit device according to claim 2 wherein the logic circuitry comprises an AND gate.

4. A DRAM integrated circuit device, comprising:
  a memory array comprising:
    multiple rows of plural memory cells;
    multiple row access lines coupled to access corresponding rows of memory cells;
    multiple paired digit lines coupled to carry data to and from the memory cells, the data being expressed as a differential voltage between the digit lines in individual pairs;
    equilibration circuitry coupled to the paired digit lines to equalize potential on the paired digit lines and thereby remove data from the paired digit lines;
  access means for accessing first and second rows of memory cells in the memory array via the row access lines during respective first and second row access cycles;
  data I/O means for placing data on selected paired digit lines during the first row access cycle;
  an equilibrate control circuit electrically coupled to the equilibration circuitry in the memory array, the equilibrate control circuit being configured to activate the equilibration circuitry following completion of the first row access cycle to remove the data on the paired digit lines when the first row is deselected; and
  an on-chip row copy circuit, electrically coupled to the memory array and the equilibrate control circuit, to inhibit the equilibrate control circuit from activating the equilibration circuitry following completion of the first row access cycle to prevent removal of the data on the paired digit lines so that the data carried by the paired digit lines which was previously stored in the first row of memory cells during the first row access cycle is copied to the second row of memory cells during the second row access cycle.

5. A DRAM integrated circuit device according to claim 4 wherein:
  the equilibrate control circuit outputs an equilibrate control signal to activate the equilibration circuitry;
  the row copy circuit comprises:
    a row copy mode detector to detect when a row copy function is enabled and to output a row copy enable signal upon detection; and
    logic circuitry coupled to the row copy mode detector, the equilibrate control circuit, and the equilibration circuitry; the logic circuitry providing a logic control signal for selectively activating the equilibration circuitry in response to the equilibrate control signal and the row copy enable signal.

6. A DRAM integrated circuit device according to claim 4 wherein:
  the equilibrate control circuit outputs an equilibrate control signal to activate the equilibration circuitry;
  the row copy circuit comprises:

a row copy mode detector to detect when a row copy function is enabled and to output a row copy enable signal upon detection; and an AND gate having a first input coupled to receive the row copy enable signal, a second input coupled to receive the equilibrate control signal, and an output coupled to the equilibration circuitry.

7. A method for operating a DRAM integrated circuit device, the DRAM integrated circuit device having a memory array with multiple rows of plural memory cells, multiple row access lines coupled to access corresponding rows of memory cells, multiple paired digit lines coupled to carry data to and from the memory cells, and equilibration circuitry coupled to the paired digit lines to remove data on the paired digit lines; the method comprising the following steps:

accessing a first row of memory cells in the memory array during a first row access cycle;

placing data on selected paired digit lines during the first row access cycle;

inhibiting the equilibration circuitry from removing the data on the paired digit lines; and accessing a second row of memory cells in the memory array during a second row access cycle so that the data carried by the paired digit lines and stored in the first row of memory cells during the first row access cycle is copied to and stored in the second row of memory cells during the second row access cycle.

* * * * *